United States Patent
Yasuda et al.

(10) Patent No.: US 7,847,272 B2
(45) Date of Patent: Dec. 7, 2010

(54) ELECTRON BEAM EXPOSURE MASK, ELECTRON BEAM EXPOSURE METHOD, AND ELECTRON BEAM EXPOSURE SYSTEM

(75) Inventors: Hiroshi Yasuda, Tokyo (JP); Akio Yamada, Tokyo (JP)

(73) Assignee: Advantest Corp., Tokyo (JP)

( * ) Notice: Subject to any disclaimer, the term of this patent is extended or adjusted under 35 U.S.C. 154(b) by 1345 days.

(21) Appl. No.: 11/235,422

(22) Filed: Sep. 26, 2005

(65) Prior Publication Data

US 2006/0115745 A1 Jun. 1, 2006

(30) Foreign Application Priority Data

Sep. 28, 2004 (JP) ............... 2004-281321

(51) Int. Cl.
*A61N 5/00* (2006.01)
(52) U.S. Cl. .................. 250/492.3; 250/491.1; 430/5
(58) Field of Classification Search .............. 250/492.3
See application file for complete search history.

(56) References Cited

U.S. PATENT DOCUMENTS 6,090,527 A * 7/2000 Yamazaki et al. ............ 430/296
6,815,693 B2 * 11/2004 Kamijo et al. ............ 250/491.1

FOREIGN PATENT DOCUMENTS

| JP | 5-335221 | 12/1993 |
| JP | 07-312341 | 11/1995 |
| JP | 2003-332225 | 11/2003 |

* cited by examiner

*Primary Examiner*—Phillip A Johnston
(74) *Attorney, Agent, or Firm*—Muramatsu & Associates

(57) ABSTRACT

An electron beam exposure system is designed to correct a proximity effect. The electron beam exposure system includes: an electron beam generation unit for generating an electron beam; an electron beam exposure mask having opening portions that are arranged so that sizes of the opening portions change at a predetermined rate in order of arrangement; a mask deflection unit for deflecting the electron beam on the electron beam exposure mask; a substrate deflection unit for deflecting and projecting the electron beam onto a substrate; and a control unit for controlling deflection amounts in the mask deflection unit and the substrate deflection unit. The direction or directions of the change may be any one of a row direction and a column direction or may be the row and column directions.

7 Claims, 15 Drawing Sheets

ELECTRON BEAM EXPOSURE MASK, ELECTRON BEAM EXPOSURE METHOD, AND ELECTRON BEAM EXPOSURE SYSTEM

CROSS-REFERENCE TO RELATED APPLICATIONS

This application is based on and claims priority of Japanese Patent Application No. 2004-281321, filed on Sep. 28, 2004, the entire contents of which are being incorporated herein by reference.

BACKGROUND OF THE INVENTION

1. Field of the Invention

The present invention relates to an electron beam exposure mask, an electron beam exposure method, and an electron beam exposure system, which correct a proximity effect in an electron beam exposure.

2. Description of the Prior Art

In recent years, electron beam exposure systems have come to be used in order to form fine patterns in lithography processes in the manufacture of semiconductor devices and the like.

It is known that, in an electron beam exposure system, there occurs a phenomenon in which line widths and the like of a pattern transferred onto resist deviate from the designed values because of influences of a so-called proximity effect in which incident electrons are scattered in the resist.

For example, when an exposure and development are performed using a line-and-space mask pattern 1 such as shown in FIG. 1A, the shapes of patterns 2 in a peripheral portion become small as shown in FIG. 1B though they have the same size as other patterns on a mask. This is because the amounts of energy received from the back scattering of incident electrons are different between inner patterns and peripheral patterns as shown in the accumulated energy distribution of FIG. 1C. FIG. 1C shows accumulated energies 3 to 4 in which the dose of a primary beam is superimposed on an accumulated energy 6 resulting from the back scattering of incident electrons. In the case of a constitution including regularly repeated patterns as in this example, the influence of the proximity effect of back scattering is saturated and equalized in an inner portion of a writing region. However, as shown in FIG. 1C, a peripheral portion has a distribution having a slope in which an accumulated energy decreases with increasing distance from a center portion.

In the case where a wafer given an accumulated energy such as shown in FIG. 1C is developed, if a threshold is assumed to be, for example, the line 5, then developed line widths are determined at positions where the threshold 5 and the energies 3 to 4 from a primary beam intersect. Accordingly, as shown in FIG. 1B, line widths are different between an inner portion and a peripheral portion of a device formation pattern.

Various methods of correcting the above-described proximity effect are being studied. For example, Japanese Unexamined Patent Publication No. Hei 5-335221 discloses an exposure method in which so-called GHOST exposure is applied to cell projection method. Here, GHOST exposure is a method which corrects a proximity effect by performing an exposure in such a manner that an auxiliary exposure pattern is superimposed on a peripheral portion of a desired device formation pattern.

Further, Japanese Unexamined Patent Publication No. 2003-332225 discloses a proximity effect correction method including the steps of: checking exposure data dimensions found based on an exposure intensity distribution function or requirements for the manufacture of a device and a mask against existing mask data; determining correction exposure data based on the result of the checking; and creating a correction light exposure by calculating an exposure intensity and a back scattering intensity using the correction exposure data dimensions.

Heretofore, in a peripheral portion of a device formation pattern in which an accumulated energy is small, patterns have been written by changing irradiation time for each pattern by variable-shaped exposure so that accumulated energies in an inner portion and a peripheral portion become equal. In this case, since variable-shaped exposure is used, the patterns are individually exposed to light, and an enormous amount of time is needed compared to that for cell projection method.

However, in the cell projection method, patterns have to be simultaneously transferred. Accordingly, it is substantially impossible to change irradiation time for each individual pattern in a peripheral portion of a device formation pattern to obtain an accumulated energy equivalent to that of an inner portion.

Further, in the method described in Japanese Unexamined Patent Publication No. Hei 5-335221, a proximity effect is corrected by exposing an auxiliary pattern to light outside a device formation pattern. Accordingly, if there is no space for that, correction cannot be performed. Additionally, though an auxiliary light exposure is determined depending on the device formation pattern, it is difficult to equalize an energy in a pattern existing in a portion in which an accumulated energy is inclined in a peripheral portion with an energy equivalent to that in an inner portion.

Moreover, in the method described in Japanese Unexamined Patent Publication No. 2003-332225, correction exposure data is not calculated for each individual pattern existing in a portion in which an accumulated energy is inclined in a peripheral portion of a device formation pattern, but an auxiliary light exposure is calculated by selecting a representative pattern. Accordingly, it is impossible to perform an exposure so that all patterns existing in the peripheral portion can be formed into desired shapes.

SUMMARY OF THE INVENTION

The present invention has been accomplished in order to solve the above-described problems. An object of the present invention is to provide an auxiliary exposure mask necessary for precisely correcting a proximity effect occurring in a peripheral portion of a device formation pattern using cell projection method, to provide a method of correcting a proximity effect using the mask, and to provide an electron beam exposure system which corrects a proximity effect.

The aforementioned problems are solved by an electron beam exposure mask having opening portions for proximity effect correction, which opening portions are arranged so that sizes of the opening portions change at a predetermined rate in order of arrangement. Here, the direction or directions of the change may be any one of a row direction and a column direction or may be the row and column directions.

Further, the aforementioned problems are solved by a method of performing an electron beam exposure. In the method, an exposure is performed on a peripheral portion of an exposed device formation pattern in a superimposed manner using an electron beam exposure mask having opening portions for proximity effect correction, which opening portions are arranged so that sizes of the opening portions change at a predetermined rate in order of arrangement. Here, in the exposure performed on the peripheral portion of the device formation pattern in a superimposed manner, an exposure may be performed in a state where a focus of an electron beam is thrown out of focus, or exposures may be performed by shifting an electron beam in in-plane directions of the electron beam exposure mask.

Furthermore, the aforementioned problems are solved by an electron beam exposure system including: an electron beam generation unit for generating an electron beam; an electron beam exposure mask having opening portions for proximity effect correction, which opening portions are arranged so that sizes of the opening portions change at a predetermined rate in order of arrangement; a mask deflection unit for deflecting the electron beam on the electron beam exposure mask; a substrate deflection unit for deflecting the electron beam passed through the electron beam exposure mask and projecting the electron beam onto a substrate; and a control unit for controlling deflection amounts in the mask deflection unit and the substrate deflection unit.

In the present invention, in order to planarize a portion in which an accumulated energy is inclined in a peripheral portion of a device formation pattern, an exposure is performed using an auxiliary exposure mask having opening portions arranged so that the sizes of the opening portions change at a predetermined rate in order of arrangement. Thus, a proximity effect occurring in the peripheral portion can be appropriately corrected by a cell projection method.

Further, the rate of the change of the opening portions can be changed by adjusting a light exposure. This makes it possible to cope with a change in energy by appropriately providing a light exposure for an auxiliary exposure mask even in the case where the slope of an accumulated energy varies depending on the shape of a pattern, eliminates the necessity for fabricating a mask for each energy slope, and makes it possible to efficiently correct a proximity effect.

Furthermore, by performing an auxiliary exposure out of focus, a pattern configured for an auxiliary exposure is not resolved, and an energy level can be planarized. Thus, a desired pattern can be more precisely exposed to light.

DESCRIPTION OF THE PREFERRED EMBODIMENTS

Hereinafter, embodiments of the present invention will be described with reference to drawings.

First Embodiment

Constitution of Electron Beam Exposure System

Figure 1A:
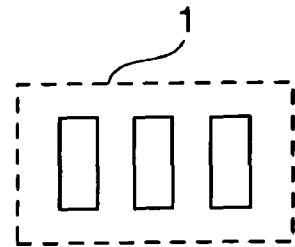
FIGS. 1A to 1C are diagrams for explaining a proximity effect in an electron beam exposure.
Figure 1B:
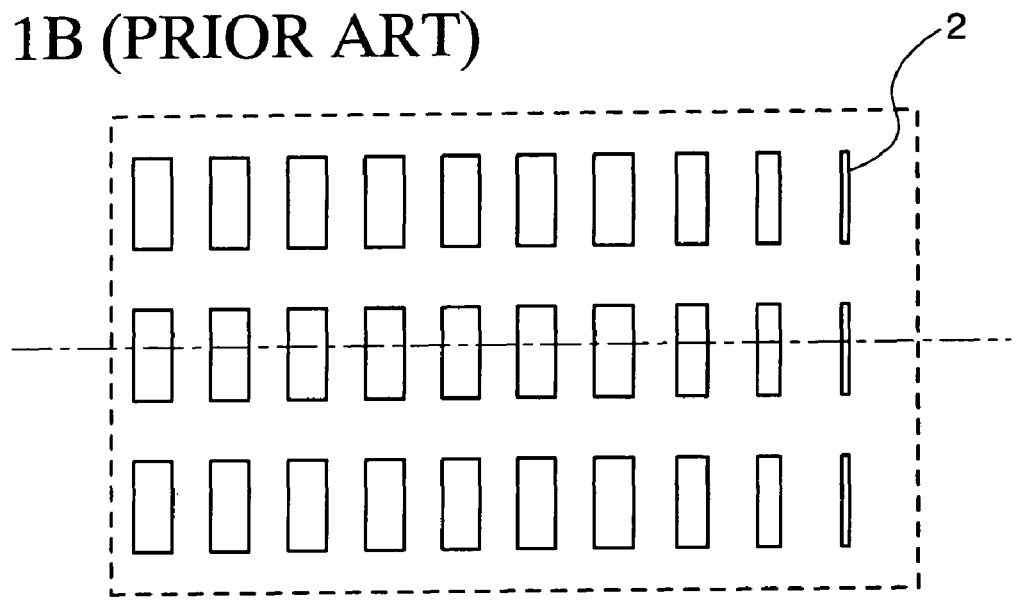
Figure 1C:
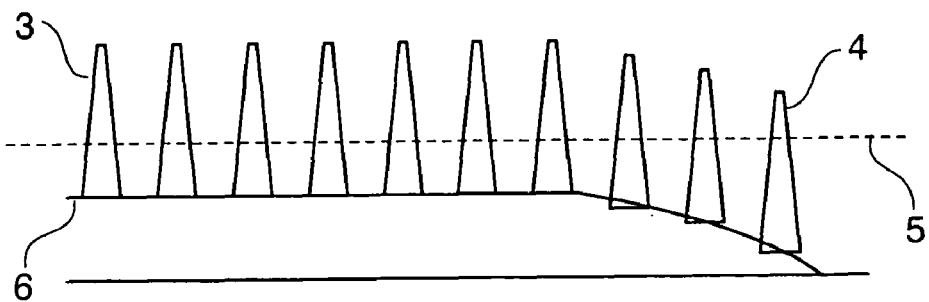
Figure 2:
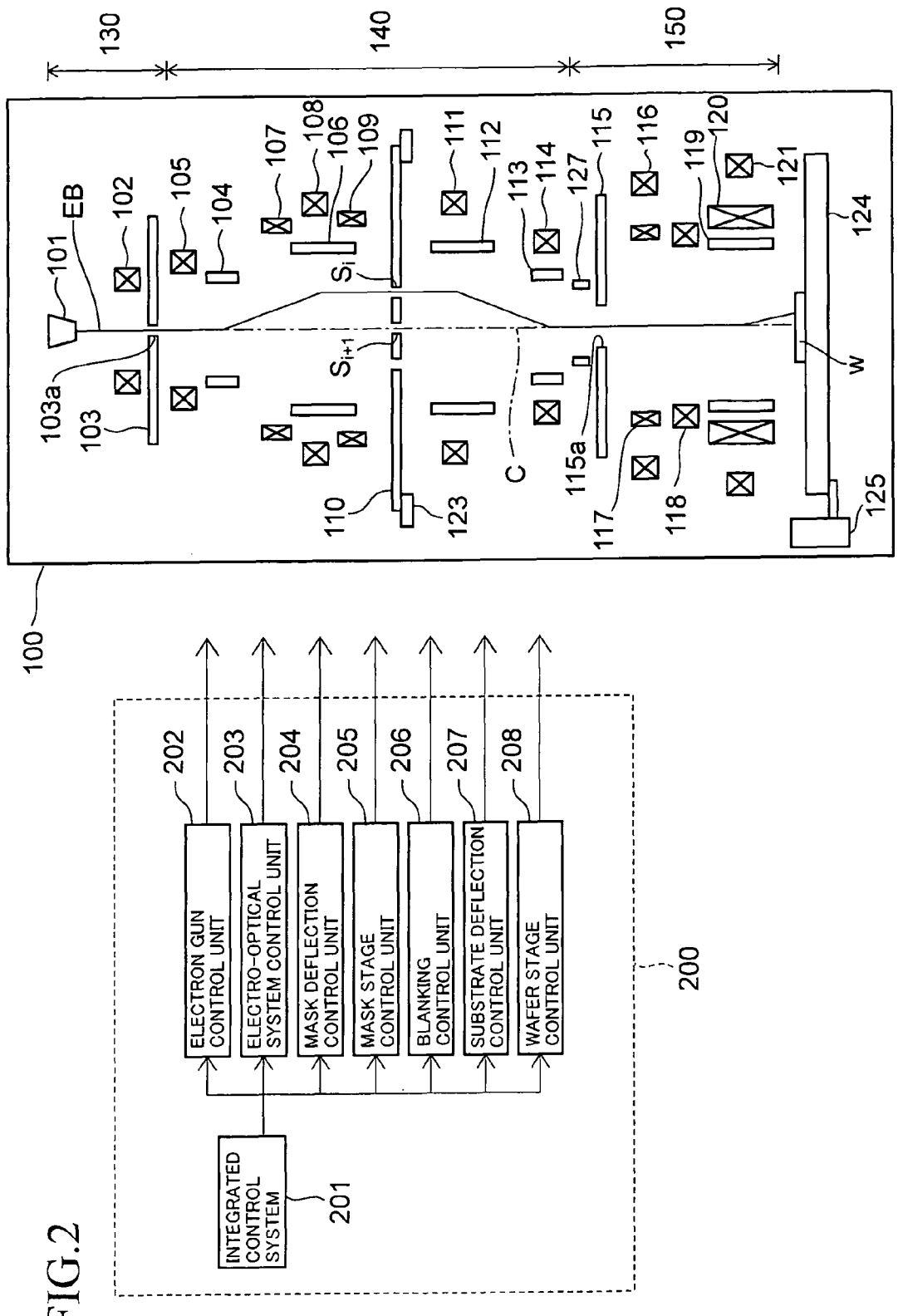
FIG. 2 is a diagram of the constitution of an electron beam exposure system used in a first embodiment of the present invention.

FIG. 2 is a diagram of the constitution of an electron beam exposure system according to this embodiment.

This electron beam exposure system is broadly divided into an electro-optical system column 100 and a control unit 200 which controls each unit of the electro-optical system column 100. The electro-optical system column 100 includes an electron beam generation unit 130, a mask deflection unit 140, and a substrate deflection unit 150, and the inside of the electro-optical system column 100 is decompressed.

In the electron beam generation unit 130, an electron beam EB generated in an electron gun 101 is converged in a first electromagnetic lens 102, and then passes through a rectangular aperture 103a of a beam-shaping mask 103, whereby the cross section of the electron beam EB is shaped into a rectangular shape.

After that, an image of the electron beam EB is formed onto an exposure mask 110 by a second electromagnetic lens 105 of the mask deflection unit 140. Then, the electron beam EB is deflected by first and second electrostatic deflectors 104 and 106 to a specific pattern S formed in the exposure mask 110, and the cross-sectional shape thereof is shaped into the shape of the pattern S.

Incidentally, though the exposure mask 110 is fixed to a mask stage 123, the mask stage 123 can be moved in a horizontal plane. In the case where a pattern S is used which lies over a region exceeding the deflection range (beam deflection region) of the first and second electrostatic deflectors 104 and 106, the pattern S is moved to the inside of the beam deflection region by moving the mask stage 123.

Third and fourth electromagnetic lenses 108 and 111, which are respectively placed over and under the exposure mask 110, have the role of forming an image of the electron beam EB onto a substrate W by adjusting the amounts of currents flowing therethrough.

The electron beam EB passed through the exposure mask 110 is returned to an optical axis C by the deflection functions of the third and fourth electrostatic deflectors 112 and 113, and then the size of the electron beam EB is reduced by a fifth electromagnetic lens 114.

In the mask deflection unit 140, first and second correction coils 107 and 109 are provided. These correction coils 107 and 109 correct beam deflection errors generated in the first to fourth electrostatic deflectors 104, 106, 112, and 113.

After that, the electron beam EB passes through an aperture 115a of a shield plate 115 partially constituting the substrate deflection unit 150, and projected onto the substrate W by first and second projection electromagnetic lenses 116 and 121. Thus, an image of the pattern of the exposure mask 110 is transferred onto the substrate W at a predetermined reduction ratio, e.g., a reduction ratio of 1/60.

In the substrate deflection unit 150, a fifth electrostatic deflector 119 and an electromagnetic deflector 120 are provided. The electron beam EB is deflected by these deflectors 119 and 120. Thus, an image of the pattern of the exposure mask is projected onto a predetermined position on the substrate W.

Furthermore, in the substrate deflection unit 150, provided are third and fourth correction coils 117 and 118 for correcting deflection errors of the electron beam EB on the substrate W.

The substrate W is fixed to a wafer stage 124 which can be moved in horizontal directions by a driving unit 125 such as a motor. The entire surface of the substrate W can be exposed to light by moving the wafer stage 124.

(Explanation for Control Unit)

The control unit 200 has an electron gun control unit 202, an electro-optical system control unit 203, a mask deflection control unit 204, a mask stage control unit 205, a blanking control unit 206, a substrate deflection control unit 207, and a wafer stage control unit 208. The electron gun control unit 202 controls the electron gun 101, and controls the acceleration voltage of the electron beam EB, beam radiation conditions, and the like. Further, the electro-optical system control unit 203 controls the amounts and the like of currents flowing into the electromagnetic lenses 102, 105, 108, 111, 114, 116, and 121, and adjusts the magnification, focal point, and the like of the electro-optical system constituted by these electromagnetic lenses. The blanking control unit 206 deflects the electron beam EB generated before the start of an exposure onto the shield plate 115 by controlling the voltage applied to a blanking electrode 127, thus preventing the electron beam EB from being applied to the substrate W before an exposure.

The substrate deflection control unit 207 controls the voltage applied to the fifth electrostatic deflector 119 and the amount of a current flowing into the electromagnetic deflector 120 so that the electron beam EB is deflected onto a predetermined position on the substrate W. The wafer stage control unit 208 moves the substrate W in horizontal directions by adjusting the driving amount of the driving unit 125 so that the electron beam EB is applied to a desired position on the substrate W. The above-described units 202 to 208 are integrally controlled by an integrated control system 201 such as a workstation.

Figure 3A:
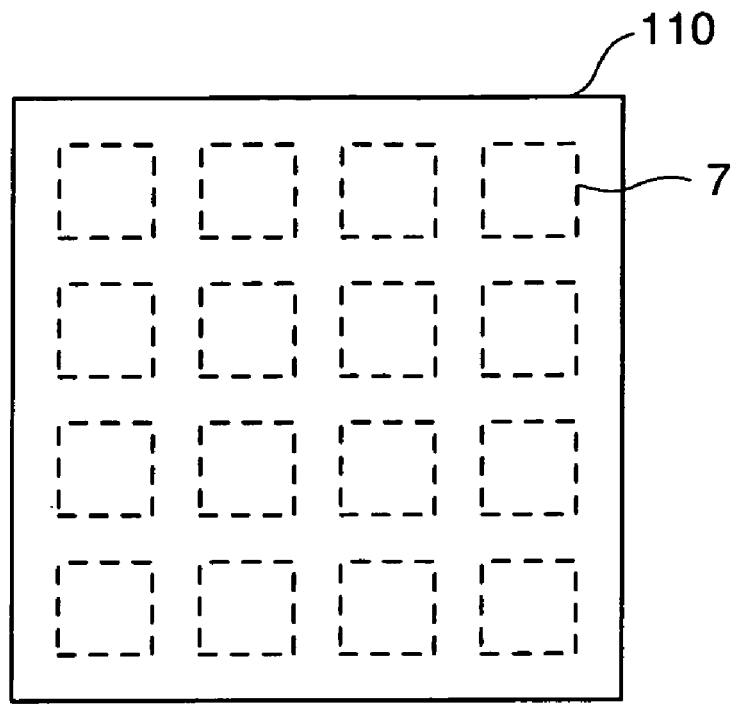
FIGS. 3A and 3B are diagrams (part I) for explaining an auxiliary exposure mask used in the first embodiment of the present invention.
Figure 3B:
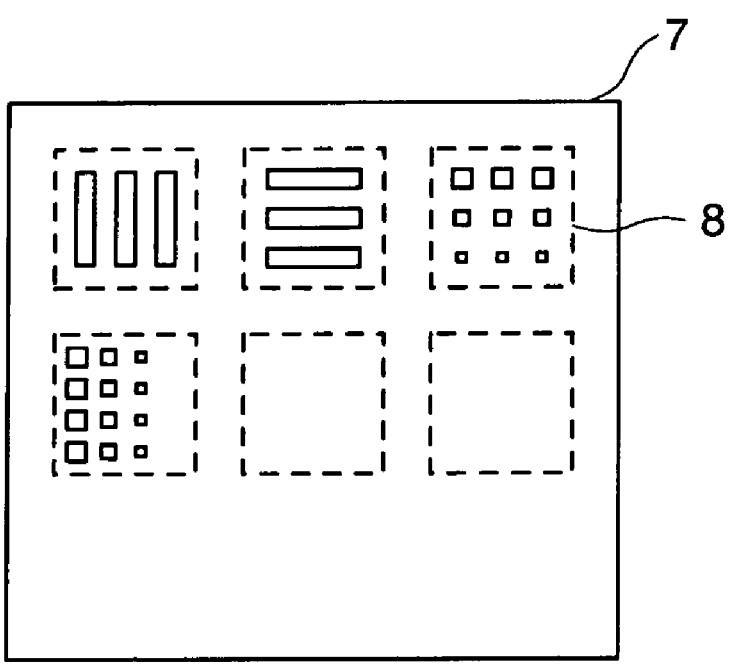

FIG. 3A is a plan view of the aforementioned exposure mask 110 made of silicon material. In the exposure mask 110, a plurality of rectangular sections 7 is arranged in the form of a matrix. As shown in FIG. 3B, in each of the rectangular sections 7, for example, rectangular subsections 8 having side lengths of approximately 300 μm are arranged in the form of a matrix. In the subsections 8, openings having a plurality of types of patterns are provided. These subsections 8 are referred to as CPs (cell projections).

Figure 4A:
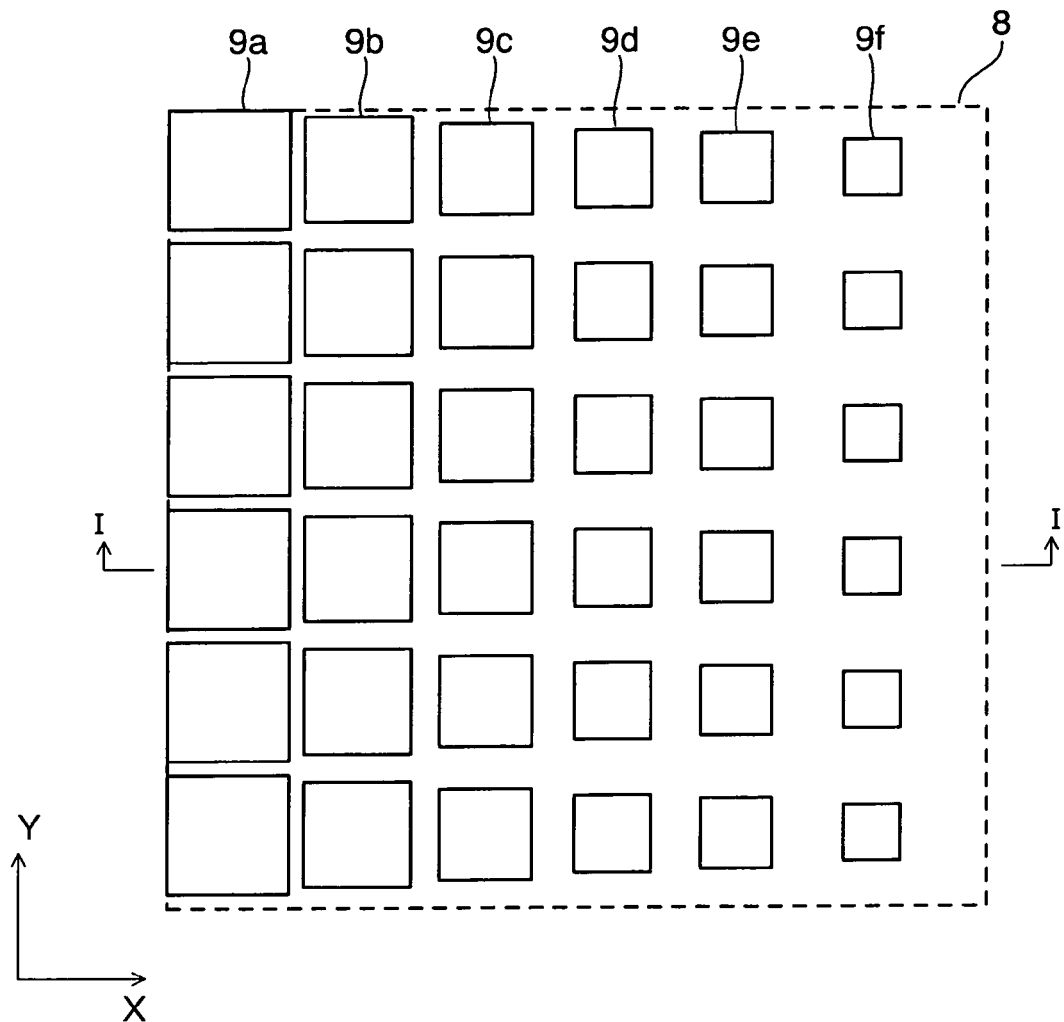
FIGS. 4A and 4B are diagrams (part II) for explaining the auxiliary exposure mask used in the first embodiment of the present invention.
Figure 4B:
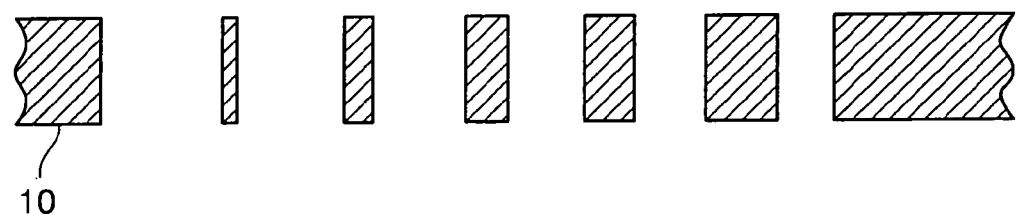

FIG. 4A is a diagram showing the constitution of a pattern of an auxiliary exposure mask used in this embodiment. Further, FIG. 4B is a diagram showing the cross section 10 taken along the I-I line of FIG. 4A.

As shown in FIG. 4A, in the auxiliary exposure mask of this embodiment, openings 9a to 9f having different sizes are formed. The sizes of openings decreases linearly in the X direction (row direction). Further, the centers of the openings are arranged in a grid pattern. Each row has openings having the same size. The sizes of openings decrease with each row.

Figure 6A:
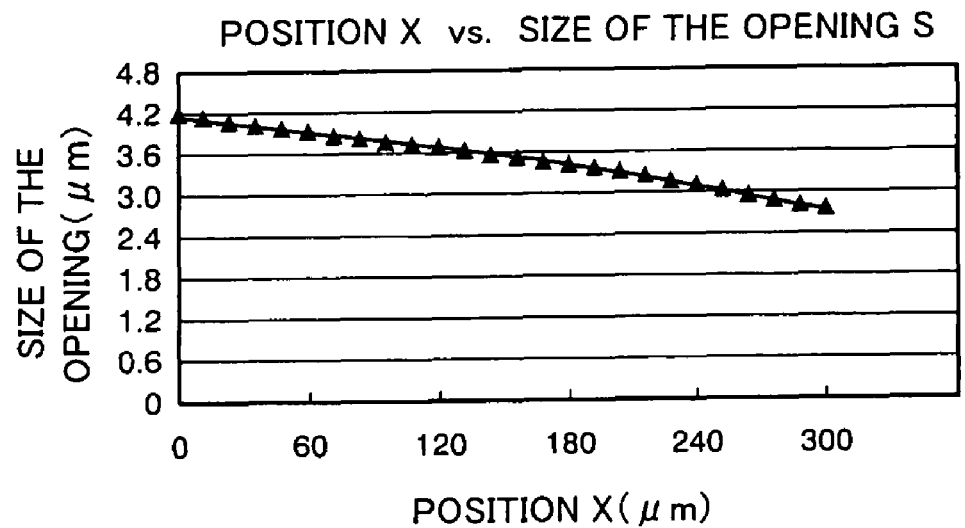
FIG. 6A is a graph showing the relationship between the position of an opening of a CP and an opening size.
Figure 6B:
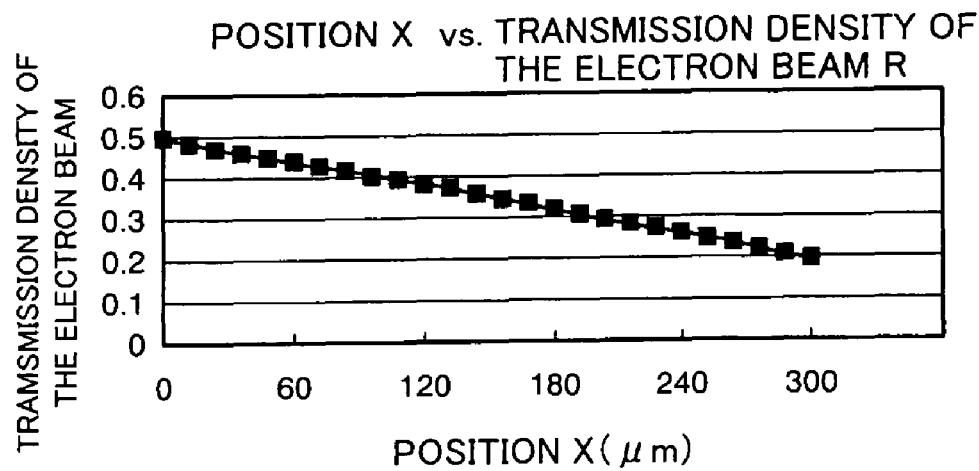
FIG. 6B is a graph showing the relationship between the position of an opening of a CP and a transmission beam density.

For example, when the transmission density of the electron beam at the position of an opening portion 9a on the left of FIG. 4A was set to 0.5 and the transmission density of the electron beam at the position of an opening portion 9f on the right was set to 0.2 so that the position of an opening and the transmission density of the electron beam have the relationship shown in FIG. 6B, the sizes of opening portions were found by calculations.

FIG. 6A is a graph showing the result of calculating the relationship between the position of an opening of a mask and the size of the opening. As shown in FIGS. 6A and 6B, the transmission density of the electron beam can be changed from 0.5 to 0.2 in the left-to-right direction by varying the sizes of openings so that the size of an opening on the left of FIG. 4A becomes approximately 4.2 μm and that the size of an opening on the right becomes approximately 2.7 μm.

Figure 5A:
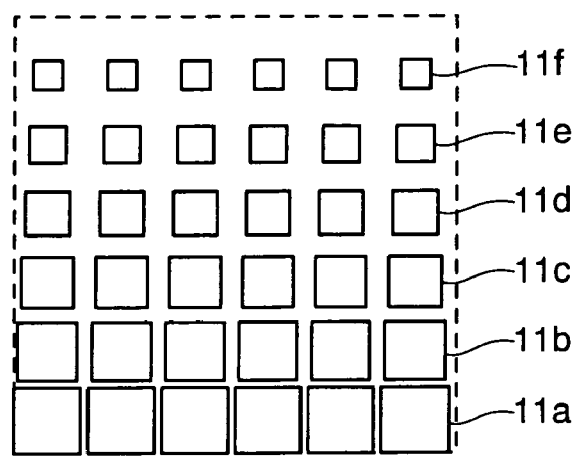
FIGS. 5A to 5C are plan views of masks used in the first embodiment of the present invention.
Figure 5B:
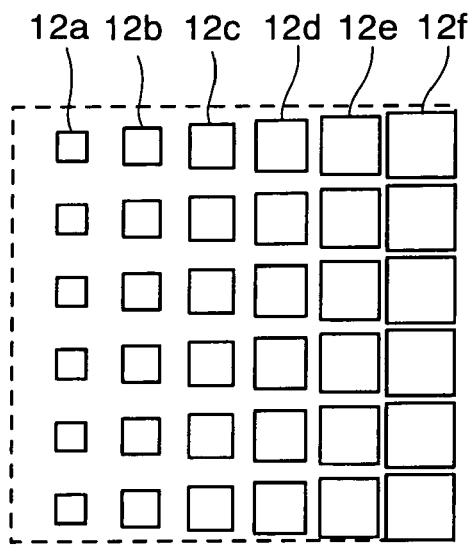
Figure 5C:
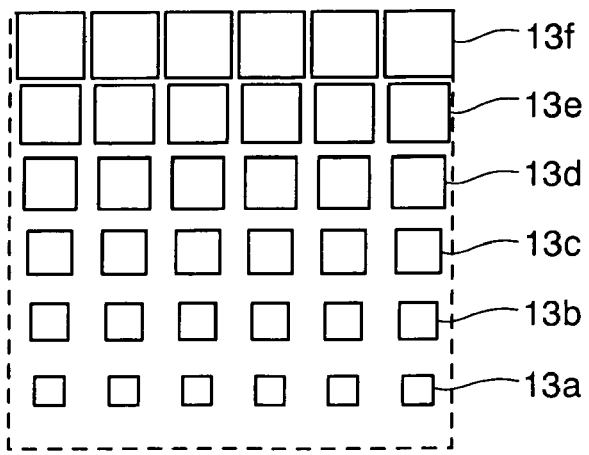

FIG. 4A is a pattern in which the sizes of openings decrease in the X direction (row direction). However, four types are prepared as basic auxiliary exposure mask patterns and include, in addition to the above-described one, a pattern (11a to 11f) in which the sizes of openings decrease in the Y direction (column direction), a pattern (12a to 12f) in which the sizes of openings increase in the X direction (row direction), and a pattern (13a to 13f) in which the sizes of openings increase in the Y direction (column direction), as shown in FIGS. 5A to 5C.

Incidentally, in this embodiment, a description has been given by assuming that the shapes of openings constituting the auxiliary exposure mask are rectangular. However, the shapes thereof are not limited to this but may be, for example, circular.

Next, a method of correcting a proximity effect using the above-described auxiliary exposure mask will be described.

Figure 7A:
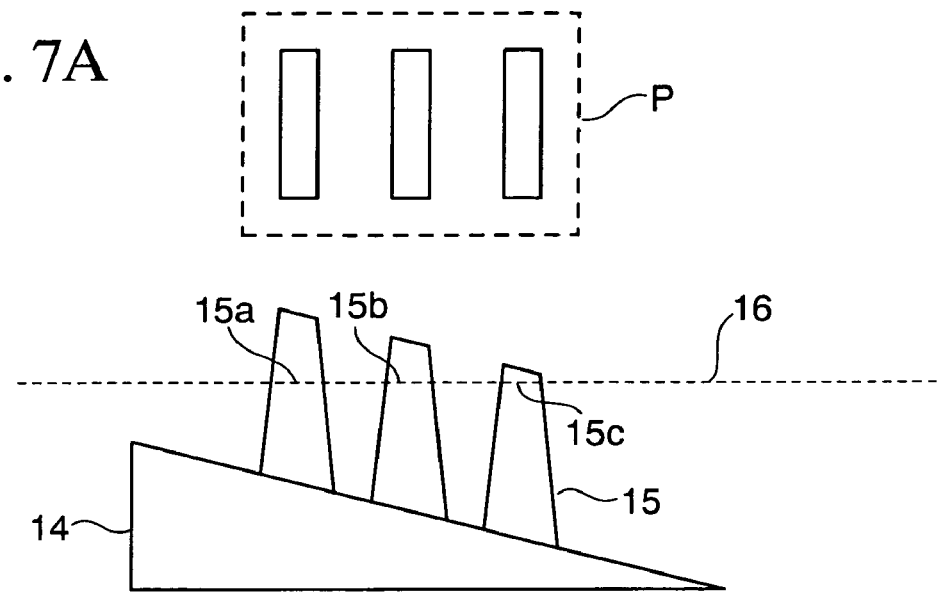
FIGS. 7A to 7C are diagrams (part I) for explaining a method of correcting a proximity effect.

FIG. 7A is a diagram showing the distribution of energy accumulated in a peripheral portion of a device formation pattern when a pattern P is repeatedly exposed to light. As shown as the slope of an accumulated energy distribution 14, the energy level decreases toward the outside. Accordingly, when the pattern P is exposed to light and developed, energies (15a to 15c) reaching a threshold 16 of a development level become different from one another. Thus, a pattern different from that desired is formed.

In order to cope with this, the energy required for planarizing the slope portion of the accumulated energy distribution 14 can be found by a calculation. Based on the result of the calculation, what auxiliary exposure mask to use for an exposure is determined.

Figure 7B:
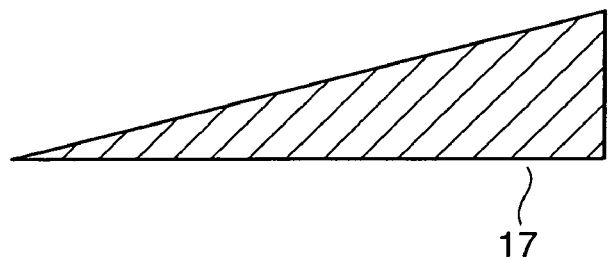

For the slope of the accumulated energy distribution 14 of FIG. 7A, the mask pattern shown in FIG. 5B is selected based on the result of a calculation. When an exposure is performed using the mask shown in FIG. 5B, an accumulated energy distribution 17 forms a slope such as shown in FIG. 7B. Accordingly, when an exposure is performed on the slope portion of the accumulated energy distribution 14 in a superimposed manner using this mask, the slope can be eliminated because the slope of the accumulated energy distribution 14 and that of the accumulated energy distribution 17 are combined together as shown in FIG. 7C.

Here, the accumulated energy in a peripheral portion of the device formation pattern needs to be planarized as a result of performing an exposure using the auxiliary exposure mask. To do so, it is important to prevent an auxiliary exposure mask pattern from being resolved. A pattern can be prevented from being resolved by performing an exposure with the pattern out of focus. Methods of throwing the pattern out of focus include a method in which an exposure is performed with the focus of a lens shifted and a method in which an exposure is performed with the pattern shifted in the direction perpendicular to the plane thereof.

Figure 8A:
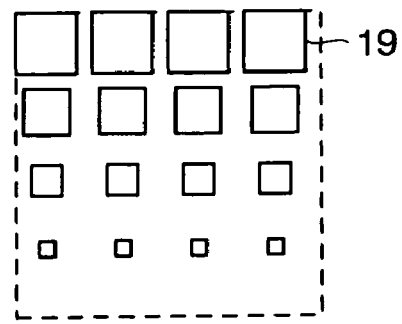
FIGS. 8A to 8F are diagrams for explaining an energy distribution obtained when a pattern is thrown out of focus.
Figure 8B:
Figure 8C:
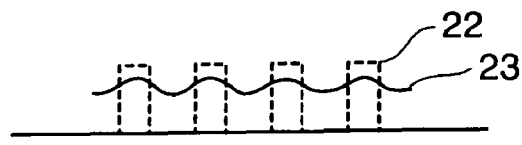
Figure 8D:
Figure 8E:
Figure 8F:

For the pattern 19 shown in FIG. 8A, for example, an exposure is performed in such a manner that the focal points of the electromagnetic lenses of the electron beam exposure system 100 are shifted. FIG. 8B is a plan view obtained when the pattern of FIG. 8A is exposed to light. A pattern 20 becomes a blurred shape such as a pattern 21 by performing an exposure with the focus shifted. FIG. 8C is a diagram showing the energy of electrons received by resist. Energy 22 is changed to energy 23 by performing an exposure with the focus shifted. FIG. 8D is a plan view obtained when an exposure is performed with a pattern shifted in the direction perpendicular to the plane thereof. A pattern 24 becomes a blurred shape such as a pattern 25 by performing an exposure with the focus shifted. FIG. 8E is a diagram showing the energy of electrons received by resist. Energy 26 becomes energy 27 by performing an exposure with the focus shifted. FIG. 8F is a diagram showing energy for the case where an exposure is performed with patterns shifted and superimposed. Energy 28 in which the energy 23 shown in FIG. 8C and the energy 27 shown in FIG. 8E are combined together is obtained. Thus, FIG. 8F shows that the superimposed energy can be equalized.

Figure 7C:
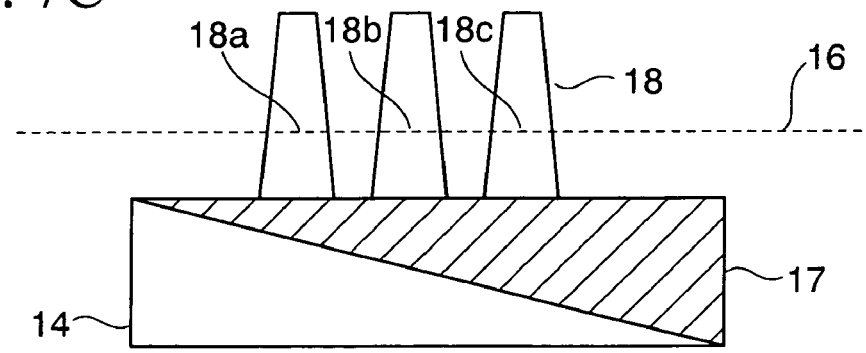

As described above, the accumulated energy distribution 14 can be planarized as shown in FIG. 7C by performing an exposure on the slope portion (peripheral portion of the device formation pattern) of the accumulated energy distribution 14 in a superimposed manner and in such a manner that the auxiliary exposure mask shown in FIG. 5B is thrown out of focus. Thus, the line widths 18a to 18c of respective patterns at the threshold 16 of the development level are equalized, and a proximity effect is corrected, whereby a desired pattern can be obtained.

Figure 9A:
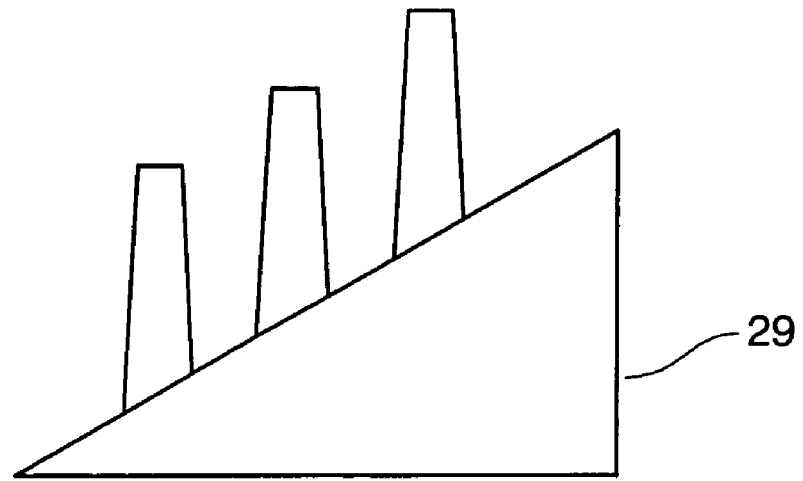
FIGS. 9A and 9B are diagrams for explaining the relationship between a light exposure for a mask used in the first embodiment of the present invention and an energy distribution.
Figure 9B:
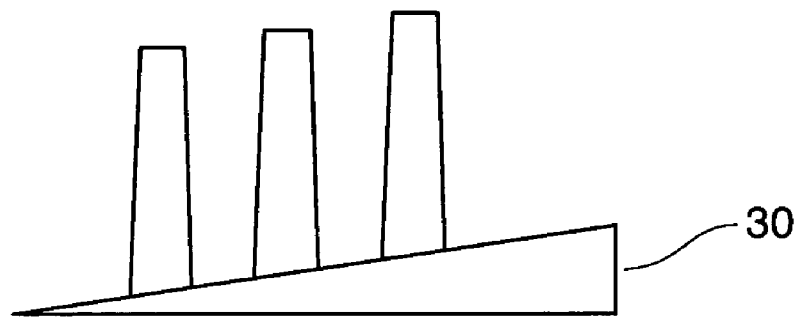

Incidentally, the angle of the slope of the accumulated energy distribution 14 such as shown in FIG. 7A actually varies depending on a mask pattern to be exposed to light, the type of resist, a substrate, and the like. Accordingly, in order to planarize the slope of an accumulated energy distribution, there is a need to change the slope angle of each individual accumulated energy distribution. The slope angle of an accumulated energy distribution generated by an auxiliary exposure mask can be changed by adjusting the light exposure for the case where the auxiliary exposure mask is used. FIGS. 9A and 9B are diagrams showing energy distributions for the cases where the light exposure is changed using the auxiliary exposure mask shown in FIG. 5B. FIG. 9A is the case where the light exposure is large, and FIG. 9B is the case where the light exposure is small. As shown in FIGS. 9A and 9B, as the light exposure increases, the slope angle of an energy distribution 29 increases; and, as the light exposure decreases, the slope angle of an energy distribution 30 decreases.

Further, the length of the slope portion of the accumulated energy in a peripheral portion also varies depending on an exposure pattern, resist, and the like. Accordingly, when the slope portion is long, planarization using an auxiliary exposure mask cannot be performed in one exposure.

Figure 10A:
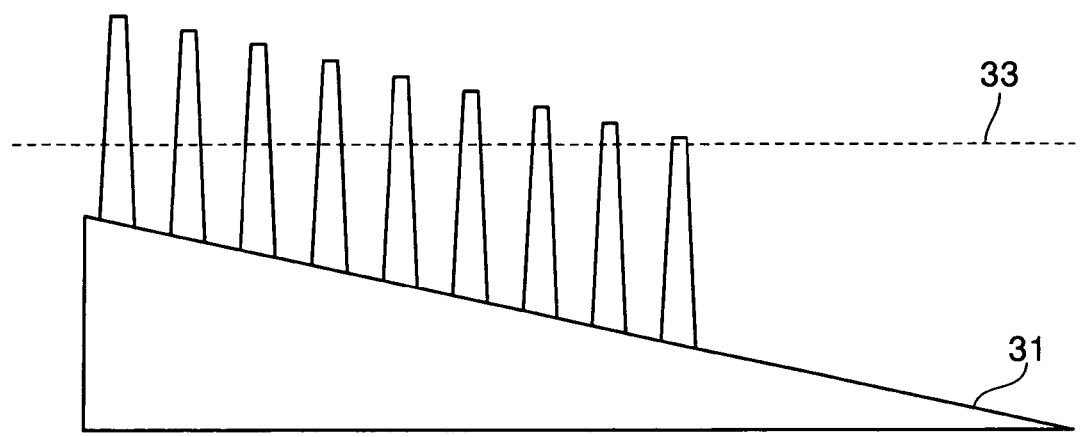
FIGS. 10A and 10B are diagrams (part II) for explaining a method of correcting a proximity effect.

In a cell projection method in this embodiment, the length of each side of the cross section of the electron beam is assumed to be 5 μm. Accordingly, in the case where a slope portion 31 is longer than 5 μm as shown in FIG. 10A, correction cannot be performed in one exposure using an auxiliary exposure mask. Thus, there is a need to perform a plurality of auxiliary exposures in order to planarize the slope portion 31.

Figure 10B:
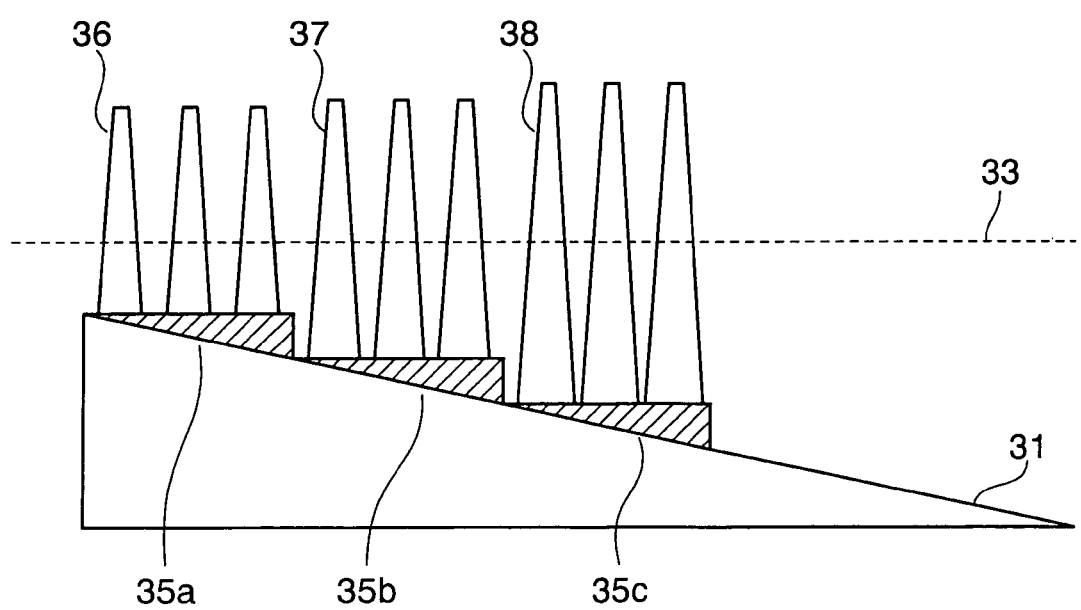

As shown in FIG. 10B, three exposures (35a to 35c) are performed by shifting the position of an auxiliary exposure mask.

As described above, the slope portion is planarized in a peripheral portion of the device formation pattern. However, as a result of performing auxiliary exposures several times, accumulated energies 35a to 35c form a stepwise shape, and are different energies. Accordingly, when the device formation pattern is exposed to light, energies reaching the threshold 33 of development differ from each other for the same light exposure, and the shapes of patterns become different. Thus, in order to equalize the energies reaching the threshold 33, the light exposure is changed so that the energy of a primary beam becomes 36 to 38, whereby the widths of lines developed are equalized.

Incidentally, in this embodiment, a desired pattern is exposed to light after the auxiliary exposure mask is exposed to light. However, the sequence of the exposures may be reversed.

As described above, in the case where an accumulated energy distribution is inclined in a peripheral portion of a device formation pattern, the energy distribution can be planarized by performing an exposure using an auxiliary exposure mask having a pattern in which the sizes of openings change linearly. The accumulated energy distribution can be found by a calculation based on the pattern density, resist, and the like, and an auxiliary exposure mask used and the light exposure can be determined accordingly. Thus, even in the case where cell projection method is adopted, a proximity effect can be effectively corrected in which the energy distribution in a peripheral portion of the device formation pattern is inclined.

Second Embodiment

With respect to the first embodiment, a description has been made for the case where an accumulated energy distribution in a peripheral portion of a device formation pattern is inclined linearly in the X direction. With respect to the second embodiment, a description will be made for the case where an accumulated energy distribution in a peripheral portion of a device formation pattern is inclined in arbitrary directions.

Figure 11:
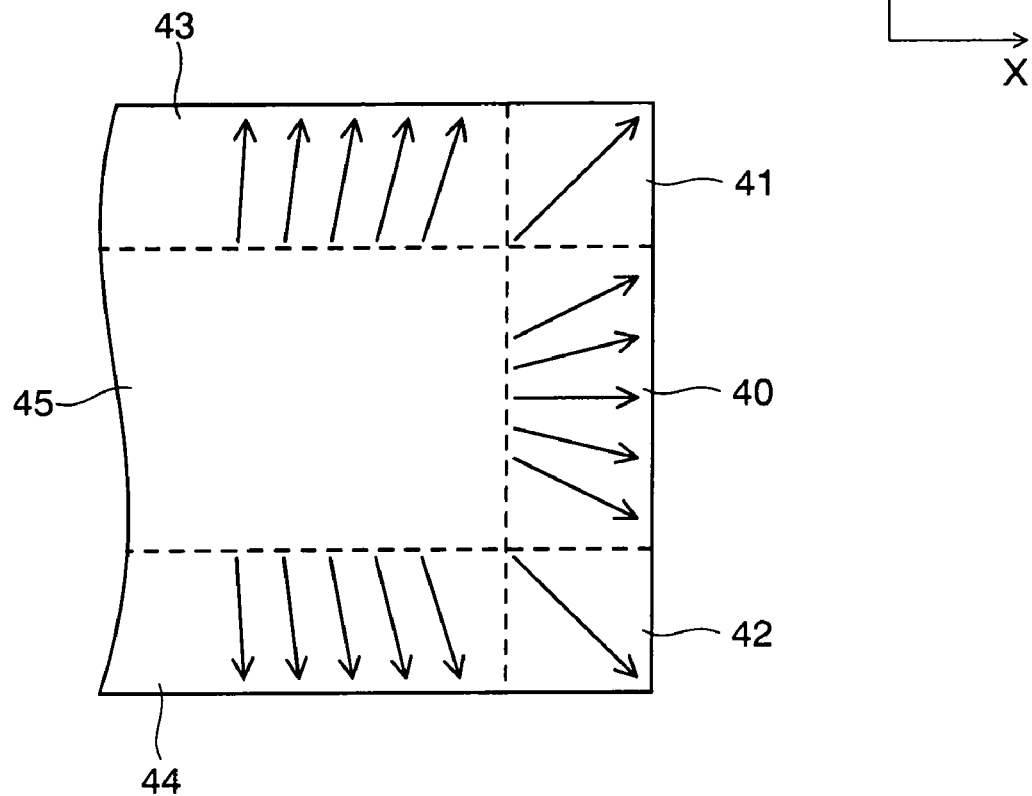
FIG. 11 is a diagram showing slope directions of an accumulated energy distribution.

FIG. 11 is a diagram schematically showing slope directions of an accumulated energy distribution in a peripheral portion of a device formation pattern.

As shown in FIG. 11, in the case where a region in which a pattern is written is rectangular, the energy distribution in a peripheral portion is affected not only by the accumulated energy in the X direction but also by the accumulated energy in the Y direction as well. Accordingly, the slope of the energy distribution is shifted toward the Y direction. For example, in the case where the writing region is a square, the slope direction of the accumulated energy distribution in a corner portion 41 becomes the direction of 45° as shown in FIG. 11. Note that peripheral portions 40 to 44 in FIG. 11 represent portions in which correction for a proximity effect is required. Further, an inside 45 represents a portion in which correction is not required.

Figure 12:
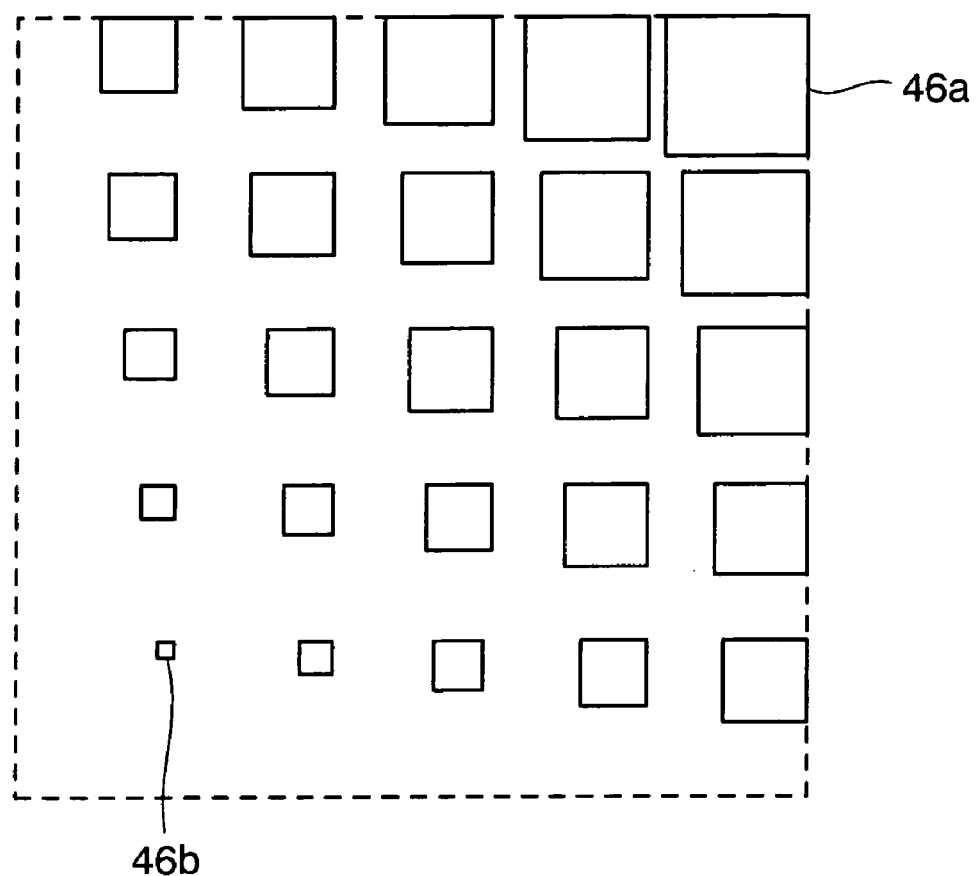
FIG. 12 is a plan view of a mask used in a second embodiment of the present invention.

In the case where the energy is inclined in the direction of 45° as in the peripheral portion 41 of FIG. 11, the slope of the energy distribution can be corrected by performing an exposure using an auxiliary exposure mask pattern which, as shown in FIG. 12, changes from a large opening 46a to a small opening 46b toward the lower left direction of 45° of the drawing.

In the above-described mask, it is assumed that the sizes of openings of the mask change at the same rate in both of the row and column directions. Accordingly, the slope of the energy in the direction of 45° can be corrected. Further, the slope of the energy in an arbitrary direction can be corrected by forming openings of a mask so that the sizes of the openings of the mask change at different rates in the row and column directions.

Figure 13A:
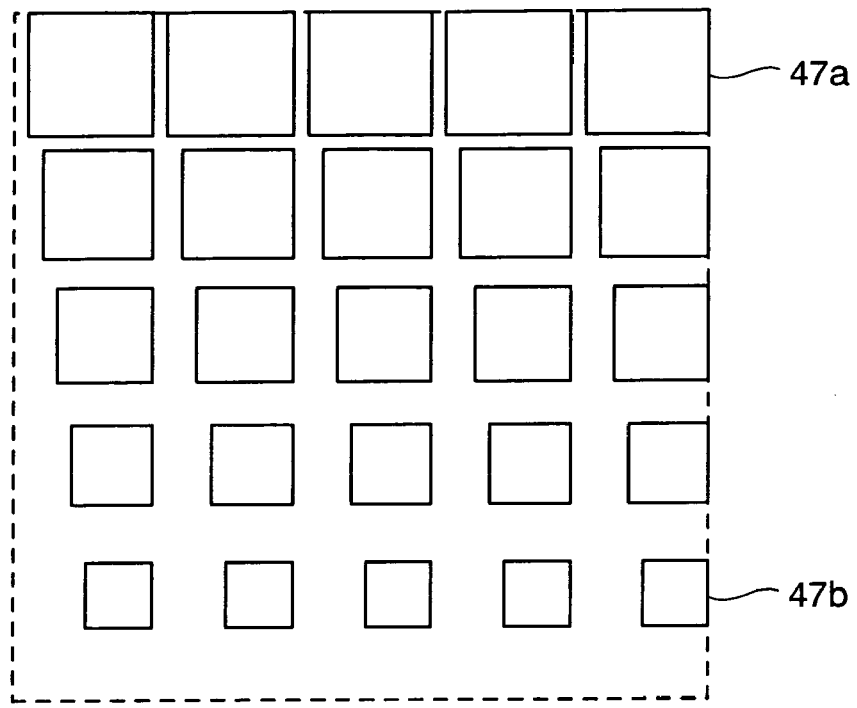
FIGS. 13A and 13B are plan views used in the second embodiment of the present invention.
Figure 13B:
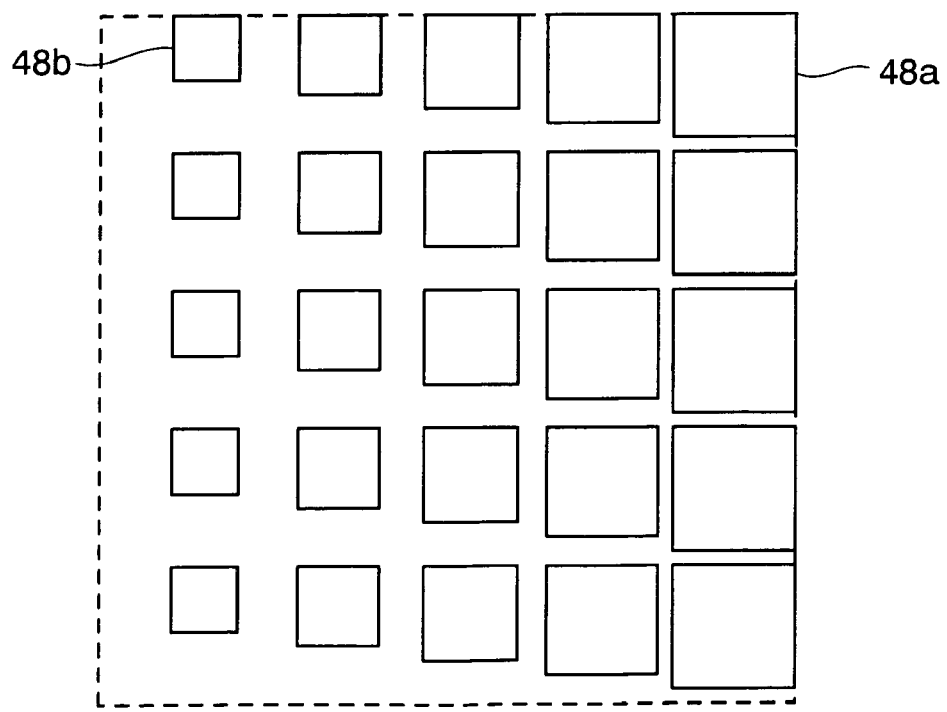

Further, an effect equivalent to that for the case where the mask shown in FIG. 12 is used can be obtained by using the auxiliary exposure masks shown in FIGS. 13A and 13B in combination, instead of using the auxiliary exposure mask shown in FIG. 12. That is, the slope of the energy in the direction of 45° can be corrected by performing exposures at the same light exposure in a superimposed manner using a mask, such as shown in FIG. 13A, which changes from a large opening 47a to a small opening 47b toward the downward direction of the drawing, and a mask, such as shown in FIG. 13B, which changes from a large opening 48a to a small opening 48b toward the left direction of the drawing.

Figure 14A:
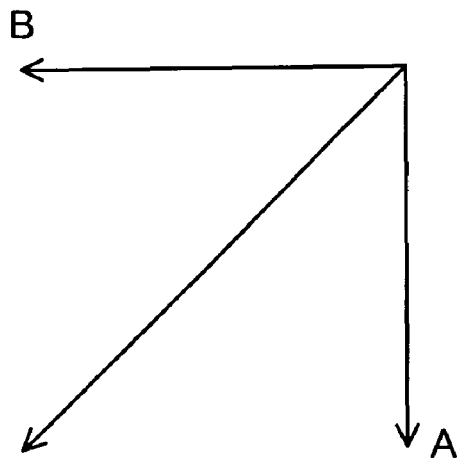
FIGS. 14A to 14C are diagrams for explaining that slope directions are changed using the masks of FIGS. 13A and 13B.
Figure 14B:
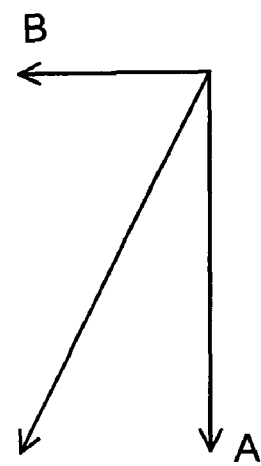
Figure 14C:
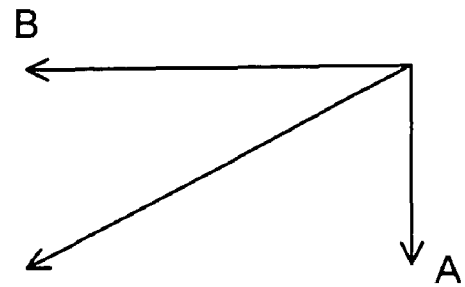

Moreover, as shown in FIGS. 14B and 14C, slopes having directions in the range of 90° can be corrected by combining the auxiliary exposure masks shown in FIGS. 13A and 13B and adjusting the respective light exposures (A, B) thereof. Furthermore, slopes in arbitrary directions can be corrected by using the masks shown in FIG. 4A and FIGS. 5A to 5C in combination.

Third Embodiment

Figure 15:
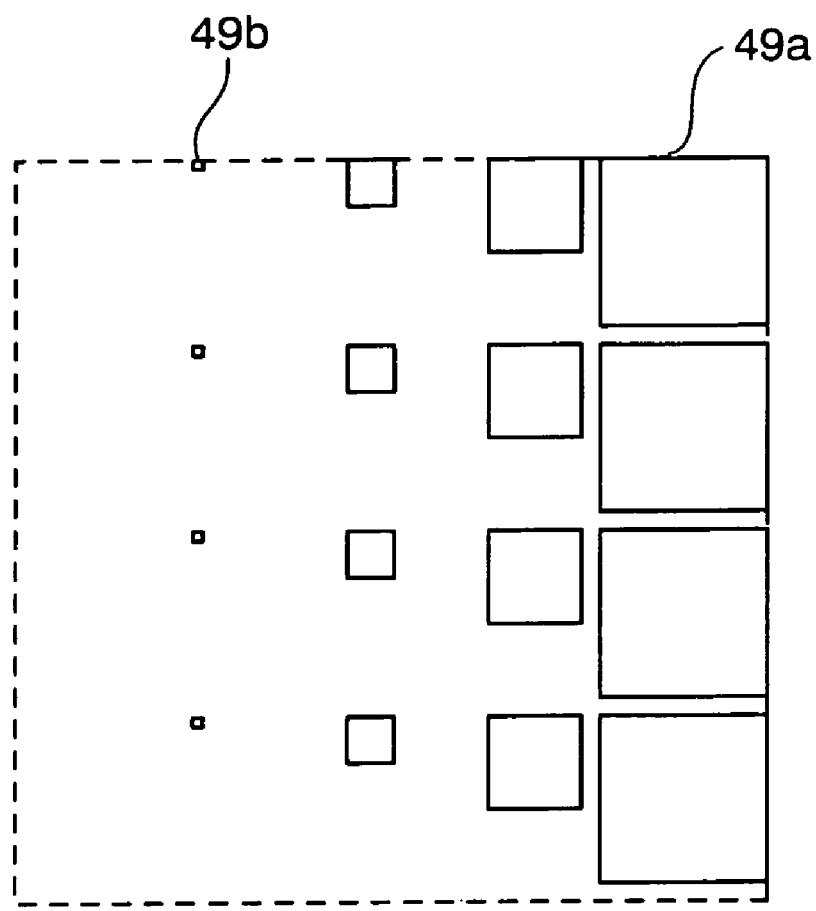
FIG. 15 is a plan view of a mask used in a third embodiment of the present invention.

In the first embodiment, the case where an accumulated energy distribution in a peripheral portion decreases linearly has been described. However, there may be cases where energy decreases quadratically, depending on the shape of a pattern, the type of resist, and the like. In such a case, a proximity effect can be corrected by preparing and using an auxiliary exposure mask, such as the mask shown in FIG. 15, which changes from a large opening 49a to a small opening 49b so that a light exposure changes quadratically. Further, the energy distribution can also be planarized by sectioning a slope region of the energy distribution into small pieces and using the auxiliary exposure mask used in the first embodiment. After the slope portion has been planarized by any of these methods, an exposure is performed by adjusting the light exposure for a device formation pattern as in the first embodiment, whereby a desired pattern can be obtained.

What is claimed is:
1. An electron beam exposure system comprising:
an electron beam generation unit for generating an electron beam;
an electron beam exposure mask having opening portions for proximity effect correction, the opening portions being arranged so that sizes of the opening portions change at a predetermined rate in order of arrangement;
a mask deflection unit for deflecting the electron beam on the electron beam exposure mask;
a substrate deflection unit for deflecting the electron beam passed through the electron beam exposure mask and projecting the electron beam onto a substrate; and
a control unit for controlling deflection amounts in the mask deflection unit and the substrate deflection unit;
wherein said control unit controls to perform an exposure operation on a peripheral portion of a device formation pattern by superimposing the electron beam exposure mask having said opening portions, and wherein the exposure is performed in a state where the electron beam is thrown out of focus to prevent a pattern of said opening portions from being resolved, and an amount of light exposure is adjusted with an auxiliary exposure mask to change a slope angle of energy distribution in order to equalize energies reaching a threshold of development.
2. The electron beam exposure system according to claim 1, wherein a direction of the change is any one of a row direction and a column direction.
3. The electron beam exposure system according to claim 1, wherein directions of the change are a row direction and a column direction.
4. The electron beam exposure system according to claim 3, wherein the rate of the change in the row direction and that in the column direction are different from each other.
5. The electron beam exposure system according to claim 1, wherein each of shapes of the opening portions is any one of a rectangular shape and a circular shape.
6. The electron beam exposure system according to claim 1, wherein centers of the opening portions are arranged in a grid pattern.
7. The electron beam exposure system according to claim 1, wherein the rate of the change is any one of a linear one and a quadratic one.

\* \* \* \* \*